(12) United States Patent
Phay et al.

(10) Patent No.: US 10,760,738 B2
(45) Date of Patent: Sep. 1, 2020

(54) SAFETY DEVICE

(71) Applicant: SICK AG, Waldkirch/Breisgau (DE)

(72) Inventors: Victor Kok Heng Phay, Singapore (SG); Adrian Schwarz, Elzach (DE)

(73) Assignee: SICK AG, Waldkirch/Breisgau (DE)

( * ) Notice: Subject to any disclaimer, the term of this patent is extended or adjusted under 35 U.S.C. 154(b) by 278 days.

(21) Appl. No.: 15/860,167

(22) Filed: Jan. 2, 2018

(65) Prior Publication Data

US 2018/0187834 A1 Jul. 5, 2018

(30) Foreign Application Priority Data

Jan. 4, 2017 (EP) .................................... 17150220

(51) Int. Cl.
*F16P 3/08* (2006.01)
*H03K 17/95* (2006.01)
*F16P 3/10* (2006.01)

(52) U.S. Cl.
CPC .................. *F16P 3/08* (2013.01); *F16P 3/10* (2013.01); *H03K 17/95* (2013.01); *H03K 2217/958* (2013.01)

(58) Field of Classification Search
CPC ........ F16P 3/08; F16P 3/40; H03K 2217/958; H03K 17/95
See application file for complete search history.

(56) References Cited

U.S. PATENT DOCUMENTS 10,095,991 B2 * 10/2018 Kanamaru ............. B25J 9/1676

FOREIGN PATENT DOCUMENTS

| DE | 20306708 U1 | 8/2003 |
| DE | 10252025 A1 | 5/2004 |
| WO | 03/012998 A1 | 2/2003 |

OTHER PUBLICATIONS

Search Report dated Jul. 21, 2017 issued in corresponding European Application No. 17150220.6.

* cited by examiner

*Primary Examiner* — Carlos Amaya
(74) *Attorney, Agent, or Firm* — Nath, Goldberg & Meyer; Jerald L. Meyer

(57) ABSTRACT

The present invention relates to a safety device for securing a machine having a sensor that is configured to detect the presence of an object in a monitored zone and to output a detection signal when an object is located in the monitored zone and having an evaluation unit that is configured to receive the detection signal from the senor and to generate an output signal in dependence on the detection signal. Provision is made in accordance with the invention that the evaluation unit is adapted furthermore to generate the output signal in dependence on at least one additional criterion.

11 Claims, 2 Drawing Sheets

SAFETY DEVICE

FIELD

The present invention relates to a safety device for securing a machine having a sensor that is adapted to detect the presence of an object in a monitored zone and to output a detection signal when an object is located in the monitored zone and having an evaluation unit that is adapted to receive the detection signal from the senor and to generate an output signal in dependence on the detection signal.

BACKGROUND

Separation devices such as casings, covers, doors, flaps or the like are frequently provided in dangerous machines to prevent persons from accessing danger zones of the machine during operation. It can furthermore be necessary for the operation of the machine that specific safety-relevant machine parts are in a predefined safe state. To ensure that the separation devices are actually closed or that the safety-relevant machine parts are in their safe state during the operation of the machine, safety devices are provided that only permit a putting into operation of the machine when the separation apparatus are closed or are in a safe position or when the safety-relevant machine parts are in their safe state. An opening or removal of the separation apparatus during the ongoing operation of the machine as a rule results in an immediate switching off of the machine.

For example, an actuator can be arranged as the object to be detected at the separation device that is only located in the monitored zone of the sensor and is only detected by the sensor when the associated separation apparatus is in its safe position in accordance with its intended purpose. An opening or removal of the separation apparatus has the result that the actuator is removed from the monitored zone and the sensor thus no longer outputs any detection signal which in turn has the result that the evaluation unit outputs a corresponding output signal. This output signal can, for example, be an opening of a safety switching contact. This safety switching contact can be monitored by the machine, with an operation of the machine only being permitted with a closed contact.

With such a safety device, a so-called proximity switch, in particular an inductive proximity switch, can, for example, be used as a sensor. A sensor configured as an inductive proximity switch generates a magnetic field in the monitored zone. If a metallic object, in particular a ferromagnetic object, is located as an actuator in this magnetic field, it effects a change of the magnetic field strength that is detected by the sensor and that initiates the output of the detection signal.

Conventional safety devices are, however, frequently manipulated. In order, for instance, to enable an operation of the machine with a removed separation device, a non-system actuator or simply another metallic object is introduced into the monitored zone of the sensor instead of the actuator arranged at the separation device and a safe state of the machine is thus incorrectly simulated. The danger of such manipulations is also present in a corresponding manner with respect to the safe state of safety-relevant machine parts.

Coded actuators can be provided to prevent such manipulations. An example for such systems are so-called RFID (radio-frequency identification) systems in which an RFID transponder is used as an actuator and an RFID reader is used as a sensor. The RFID transponder transmits a characterizing code that enables an identification of the detected object or actuator and thereby makes manipulations more difficult. However, non-coded safety systems (such as inductive sensors) and also low-level coded safety systems (such as magnetic sensors and RFID systems in a universally coded operating mode) can be manipulated since the number of available code variations is frequently limited and thus objects having the same code (e.g. with the same pattern or the same range of RFID numbers) are used for manipulation. Systems having a higher code level are frequently substantially more expensive.

In addition, with all coded safety devices, an increased effort is required on a new installation or on a replacement of sensors and/or actuators since the codes of the sensor and of the actuator have to be matched to one another and a multiple use of the same code in a respective machine should be avoided.

DE 203 06 708 U1 relates to an access protection device with whose aid an access opening of a machine can be monitored that is closable by a door. The door can be latched by means of a bolt that comprises a magnetizable yoke or a magnet closable by a yoke. The closed state of the door is monitored with the aid of a magnetic field sensor, with a sensor element additionally being provided that can receive signals from a transponder attached to the door.

A similar apparatus is described in DE 102 52 025 A1. The door is secured with the aid of a lock that has a latch and a bolt for holding the latch in its closed position. Two transponders are fastened to the latch or to the bolt. A sensing head can then only receive identification signals from the two transponders as a detection signal or as an additional criterion when the latch is in the closed position and is held by the bolt.

A further apparatus of a similar category is disclosed in WO 03/012998 A1. Here, the closed state of a door is monitored with the aid of a Hall element, with a first output signal being generated in dependence on the presence of a magnetic element. In addition, a window comparator is provided that monitors the output signal of the Hall element as to whether it is located within a predefined signal window, i.e. whether a second higher signal threshold is not exceeded. A manipulation with any desired magnets should be precluded by this additional criterion.

SUMMARY

It is the object of the present invention to provide a safety device of the initially named kind that can be manufactured, installed and serviced inexpensively with high security against manipulation.

The object is achieved by a safety device in accordance with the respective independent apparatus claim. Provision is made in accordance with the invention that the evaluation unit is adapted furthermore to generate the output signal in dependence on at least one additional criterion. Not only the actual detection signal that can only provide information on the presence of an object, for example of a separation apparatus or of a machine part or of an actuator arranged at a separation apparatus or at a machine part, in the monitored zone of the sensor is thus taken into account in the evaluation of whether predefined conditions for the generation of the output signal are present, but further parameters, environmental conditions, or sensor signals are also made use of. The fact can, for example, be utilized for this purpose that the manner how an object or actuator is introduced into the monitored zone on a manipulation attempt differs from that manner how the proper actuator approaches the sensor in regular operation. Speeds, temporal progressions, dwell times, or repetition frequencies can, for example, be taken into account, which will be explained in even more detail in the following. Additional sensor signals that are provided by integrated or external sensors of the evaluation unit can furthermore also be taken into account. This will also be explained in even more detail in the following.

The output signal can be generated immediately or also with a time delay, with the detection signal and/or the additional criterion, for example, having to be present for a specific minimum time period.

The evaluation unit can be provided as an external evaluation unit, can form an assembly with the sensor, or can be integrated in an assembly with the sensor and with other additional sensors explained in even more detail in the following.

In accordance with an advantageous embodiment, the safety device has a signal output for outputting the output signal that can be connected to a control input of the machine. Such a safety device is in particular suitable for linking dangerous machine functions to the state of separating protective apparatus of the machine so that an absence of the protective apparatus prevents or interrupts a carrying out of the dangerous functions of the machine.

The output signal is advantageously a switching signal that effects a switching off of the machine and/or allows a putting into operation of the machine. The output signal can, however, also only be a warning signal or it is only recorded for documentation purposes when the danger is of a subordinate kind, which can optionally be assessed by a further evaluation of the additional criterion or criteria.

It has proved to be advantageous for the object to be an actuator associated with the sensor. An object is understood hereby, for example, that—in accordance with the physical principle of function of the sensor—has defined inductive, capacitive, magnetic, or optical properties. The presence of a suitable actuator that in particular has to be located within a defined spatial region thus produces the generation of a detection signal. An actuator in this sense can also be a machine part per se that has corresponding properties matched to the sensor.

A machine part per se that is metallic and can therefore be detected by the sensor can also serve as an actuator in the wider sense.

In accordance with a further advantageous embodiment, the actuator is coded such that the actuator can be associated with the sensor and/or such that the actuator can be identified by the sensor. The security against manipulation is hereby further increased. The identification can, for example, take place directly by the sensor or indirectly by the evaluation unit. The association or identification is preferably possible in an unambiguous manner.

In general, the present invention can also be implemented on a safety device that is not only adapted for detecting an actuator as the object, but is rather provided for the detection of any other objects such as workpieces to be processed by the machine or foreign bodies penetrating into a safety zone. Those safety devices are in particular also covered that monitor the presence of operating staff or body parts of operating staff in a danger zone.

The sensor can be selected from a group of sensors, said group comprising:
   a mechanical sensor that is adapted to detect a mechanical contact with the object or a force exerted by the object;
   an inductive sensor that is adapted to detect a ferromagnetic or non-magnetic conductive object;
   a capacitive sensor that is adapted to detect a metallic or non-metallic object;
   a magnetic sensor that is adapted to detect a magnetic field generated by the object;
   an optical sensor that is adapted to detect light reflected or remitted by the object;
   a sound sensor, in particular an ultrasound sensor, that is adapted to detect sound waves, in particular ultrasound waves, reflected or transmitted by the object;
   and an RFID sensor that is configured to receive a code that was transmitted by an RFID transponder arranged at the object.

This list of sensors that can be used in the context of the present invention is not exclusive. It is understood that with safety devices in which the presence of an actuator is to be monitored actuators are provided that are correspondingly matched to the sensor type used, with it also being conceivable that such actuators can be used that, due to their properties, can be detected by a plurality of sensors that are based on different physical principles of function.

In accordance with a further advantageous embodiment, the sensor is furthermore adapted only to output the detection signal when the object is located in a defined part zone of the detection zone. The detection zone of a sensor in particular adapted to a contactless object detection can be divided into a near zone and into a release zone as respective part zones, with e.g. the near zone being located directly adjacent to the sensor and the release zone adjoining the near zone such that an object present in the release zone has a larger distance from the sensor than an object in the near zone. The sensor can detect the presence of an object in both part zones, but only outputs a detection signal when the object is located in the release zone. The output of an output signal releasing the machine can thus be suppressed, for instance on a manipulation, by an actuator arranged at an incorrect distance, e.g. too close to the sensor. A further protection against manipulation of the safety device is hereby provided.

Provision is made in an embodiment in accordance with the invention that the at least one additional criterion comprises the approach speed of the object to the sensor and/or the temporal progression of the approach speed. This is based on the underlying idea that the speed of an object or of an actuator that moves into the monitored zone in a regular operation of the safety device differs from that speed at which it is brought toward the sensor on a manipulation attempt that is, for example, carried out by hand. This can be due to the fact that, for example, that position at which the sensor generates a detection signal first has to be determined by trial and error for a foreign object that is to be introduced into the monitored zone instead of the regular actuator and that usually has different physical properties than the actuator.

Alternatively or additionally, the at least one additional criterion can comprise the dwell time of the object in the monitored zone. A repetition rate of sequential detections of objects in the monitored zone can furthermore be made use of as an additional criterion, in each case on its own or in combination with one or more other additional criteria.

In accordance with a further embodiment in accordance with the invention, the evaluation unit is connected to at least one vibration sensor or tremor sensor that is adapted to detect vibrations or tremors generated by the secured machine, with the at least one additional criterion comprising at least one characteristic of the detected vibrations or tremors. The presence or absence of vibrations or tremors, their amplitudes or frequencies can, for example, serve as the characteristic, with the characteristic in particular being able to be related to a corresponding threshold value. These vibrations or tremors can, for example, be those vibrations or tremors that arise on the closing of a separation apparatus at the machine. It is also conceivable that deviations of the detected vibrations from a vibration pattern that arises in a regular operation of the machine can be determined as the characteristic; for example, because the resonance behavior of the machine changes through removed separation apparatus or covers.

In accordance with a further embodiment, the evaluation unit can alternatively or additionally be connected to at least one environmental sensor, in particular to a sound sensor, a pressure sensor, or a temperature sensor, with the at least one additional criterion being at least one characteristic of a measured value detected by the environmental sensor.

In accordance with a further embodiment in accordance with the invention, the evaluation unit is adapted to generate and store at least one data pattern that
 i) represents a temporal progression of the detection signal and/or of the additional criterion for a regular operation of the machine; and/or
 ii) that represents a temporal progression of the detection signal and/or of the additional criterion for an operation of the machine on a presence of non-permitted operating conditions,
wherein the output signal is generated on the basis of a comparison of an instantaneous temporal progression of the detection signal and/or of the additional criterion with the stored data pattern.

A regular operation is understood as an operation of the machine without manipulating interventions that are suitable to impair the safety of the machine. A presence of non-permitted operating conditions is accordingly understood as the presence of manipulating interventions in the safety of the machine that can, for example, comprise a removal or opening of separation apparatus or safety covers. An instantaneous temporal progression of the detection signal or of the additional criterion is understood as a temporal progression within a short observation period that is, for example, restricted to one or a few clock cycles of the machine and is, for example, in the range of a few milliseconds up to some seconds.

It is based on the underlying fact that each machine (including the safety devices and sensors associated therewith) generates a machine-specific pattern, with this pattern in particular comprising information on an approach speed of an actuator or of an object or of the temporal progression of this speed, a dwell time of an object or of an actuator in the monitored zone, a repetition frequency of the detection, and a vibration load or tremor load during the detection detected by additional sensors. A pattern that this machine generates under the influence of safety-relevant manipulations will differ from this pattern, with the deviations not necessarily having to be present for all the detected parameters, but also being able to relate only to individual ones of the above-named criteria, Corresponding "operating patterns" or "manipulation patterns" that can be stored in the evaluation unit in the form of a library of data patterns and that can be continuously compared with currently detected information on the detection signal and/or on the at least one additional criterion can thus be generated both for regular operation of the machine and for operation under non-permitted operating conditions.

The evaluation unit is advantageously adapted to generate the data pattern as part of a teaching process. This enables a generation under specific conditions, for example conditions adapted to the installation space of the machine. It must be ensured as part of the teaching process for an operating pattern, i.e. a data pattern in regular operation, that no conditions that impair safety, e.g. open covers, non-permitted objects in the safety zone, are present that could falsify the pattern. A plurality of teaching processes for different operating situations and/or manipulation situations can in particular be carried out, In accordance with an advantageous modification, the evaluation unit is adapted to generate, to expand, and/or to adjust the data pattern during the continuous operation of the machine, The safety and availability of the machine is hereby increased since a subsequent adjustment to different operating conditions becomes possible. An expansion of the data pattern is in particular understood such that further patterns differing more or less from one another can be recognized as permitted or non-permitted and can be added to the already stored data patterns. Adjustment is in particular to be understood such that the stored data pattern or patterns is/are continuously modified in order, for example, to be able to take account of changes in the temporal progression of the additional criterion that are, for instance, due to changing clock speeds of the machine.

It has been found to be advantageous for the evaluation unit to be adapted to read the data pattern from a connected external storage unit and/or to output it to a connected external storage unit. Sets of a large number of various different data patterns can thus be made accessible in the form of a database for future uses or permit a data analysis that enables the recognition of further conceivable manipulation attempts.

Further advantageous embodiments of the invention result from the dependent claims, form the description and from the drawing.

BRIEF DESCRIPTION OF THE DRAWINGS

The present invention will be described in the following with reference to an embodiment and to the drawing. There are shown.

DETAILED DESCRIPTION

Figure 1:
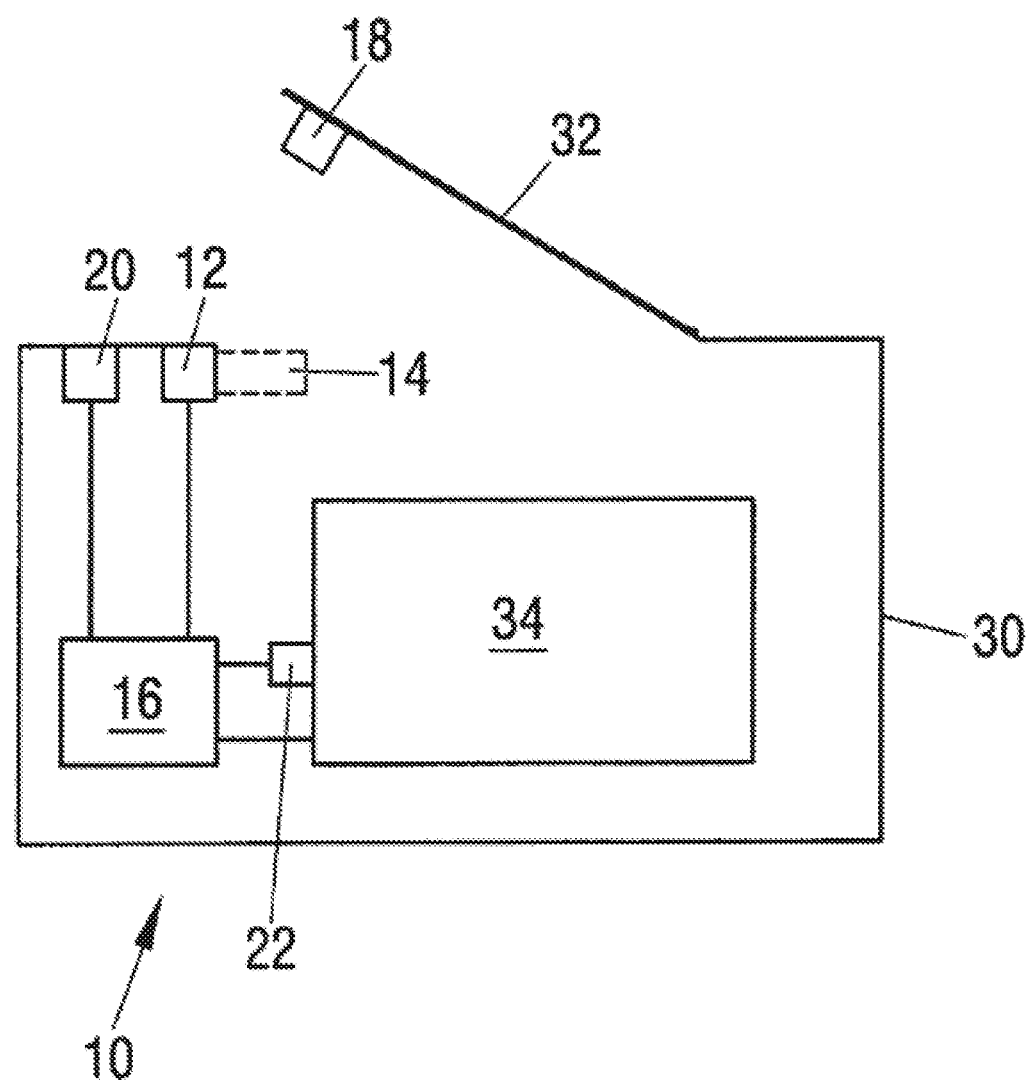
FIGS. 1 and 2 a safety device in accordance with the invention that is arranged at a separation apparatus to be opened that surrounds a machine to be secured.
Figure 2:
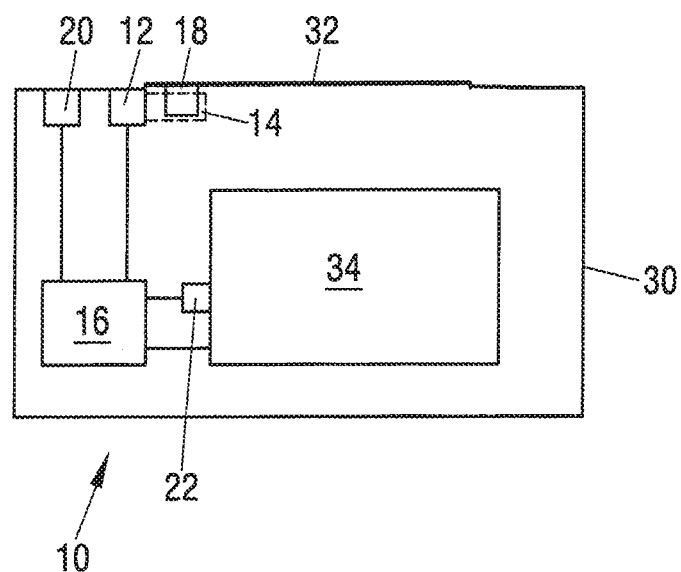

FIGS. 1 and 2 show a separation apparatus 30 having a protective cover 32 to be opened in an open position (FIG. 1) and a closed position (FIG. 2) that surround a machine 34 to be secured to prevent access to a danger zone of the machine 34 during a dangerous operation.

A safety device 10 is arranged at the separation apparatus 30 and includes a sensor 12 that is adapted to detect the present of an object in the form of an actuator 18 in a monitored zone 14 and includes an evaluation unit 16 connected to the sensor 12.

The actuator 18 is arranged at the movable protective cover 32 of the separation device 30 such that it is located within the monitored zone 14 of the sensor 12 with a closed protective cover 32 (FIG. 2).

A signal output of the evaluation unit 16 is connected to a control input of the machine 34.

The safety device 10 in the embodiment further comprises two vibration sensors 20, 22 or tremor sensors, with the vibration sensor 20 being arranged close to the sensor 12 and being adapted to detect vibrations that occur on the closing of the protective cover 32. The vibration sensor 22 is arranged at the machine 34 and is adapted to detect vibrations or tremors occurring during the operation of the machine 34. In modifications, only one of the vibration sensors 20, 22 or also further vibration sensors or tremor sensors can also be provided. In further modifications, other environmental sensors such as sound sensors, pressure sensors, or temperature sensors can also be provided alternatively or additionally. In accordance with even further modifications, all or some of the vibration sensors or tremor sensors and/or other environmental sensors can be integrated in the sensor 12 construction-wise.

The sensor 12 can be configured as an inductive sensor and the actuator 18 can accordingly be produced from a ferromagnetic material so that the sensor 12 can determine the present of the actuator 18 in the monitored zone 14 with a closed protective cover 32 and can transmit a corresponding detection signal to the evaluation unit 16.

The evaluation unit 16 is adapted to generate an output signal in dependence on the detection signal and to transmit it to the machine 34. The output signal can, for example, comprise a switching contact being closed that only permits the machine 34 to be put into operation in this closed position. If the switching contact is open or opened, the putting into operation of the machine 34 is not possible or the running machine 34 is switched off.

The evaluation unit 16 only generates an output signal that permits the operation of the machine when the sensor 12 generates the detection signal on the basis of the presence of the actuator 18 in the monitored zone 14, i.e. with a closed protective cover 32 (FIG. 2) and when furthermore one or more additional criteria are satisfied.

The sensor 12 can, for example, be adapted to determine the degree of a change of the magnetic field generated by the sensor 12 effected by the presence of the actuator 18 or of a foreign object introduced for manipulation purposes. A distinction can thus be made, for example, whether the associated actuator 18 is actually located in the monitored zone 14 or whether only a different suitable ferromagnetic object, for example a coin, has been introduced into the monitored zone 14 to be able to carry out a putting into operation of the machine 34 with manipulative intent with an open protective cover 32.

The speed or a value derived therefrom at which the actuator 18 (or a manipulative object) is introduced into the monitored zone 14 can be used as a further additional criterion. The speed or also a speed progression can be determined, for example, in that the temporal change of the magnetic field generated by the sensor 12 is measured. This is based on the underlying idea that the actuator 18 typically enters into the monitored zone with a characteristic speed progression when the protective cover 32 is closed. This progression can only be imitated with difficulty by an introduction of a manipulative object.

Additionally or alternatively, a further sensor signal generated by the vibration sensor 20 could also be made use of that arises on the closing of the protective cover 32 due to an abutment at the fixed part of the separation apparatus 30. This typical vibration pattern that arises by closing the protective cover 32 can also only be simulated with great difficulty and above all not with the required temporal coincidence with the detection signal generated by the sensor 12.

Vibrations that are generated by the vibration sensor 22 arranged at the machine 34 and that are due to an operation of the machine can also be made use of for the generation of the output signal by the evaluation unit 16. This can take place, for example, in a form such that the operation of the machine 34 at a very low working speed, for example for set-up purposes, can also be tolerated with an open protective cover 32, but higher clock speeds of the machine 34 that also bring about an increased risk for operating staff lead to the generation of an output signal stopping the machine with an open protective cover 32.

In accordance with a further modification, the signals generated by the sensor 12 and/or by the vibration sensors 20, 22 and/or other additional criteria or their temporal progressions and/or repetition rates can be detected by the evaluation unit 16 and can be stored in the form of data patterns in the evaluation unit 16, as has already been explained in more detail above. Such data patterns can be generated and stored for a regular operation of the machine 34 without manipulating interventions and/or for an operation under manipulative conditions. The data underlying the data patterns are continuously determined during the operation of the safety device 10 or of the machine 34 and are compared with the stored data patterns. An adaptation of the data patterns to changing operating conditions or also an expansion by adding additional data patterns can be provided.

Reference Numeral List 10 safety device
12 sensor
14 monitored zone
16 evaluation unit
18 actuator
20, 22 vibration sensor
30 separation apparatus
32 protective cover
34 machine

The invention claimed is:

1. A safety device for securing a machine, the safety device comprising:
   a sensor that is adapted to detect the presence of an object in a monitored zone and to output a detection signal when an object is located in the monitored zone; and
   an evaluation unit that is adapted to receive the detection signal from the sensor and to generate an output signal in dependence on the detection signal,
   wherein the evaluation unit is adapted furthermore to generate the output signal in dependence on at least one additional criterion, wherein the evaluation unit is adapted to generate and store at least one data pattern that
   i) represents a temporal progression of the detection signal and/or of the additional criterion for a regular operation of the machine; and/or
   ii) that represents a temporal progression of the detection signal and/or of the additional criterion for an operation of the machine on a presence of non-permitted operating conditions,
   with the output signal being generated on the basis of a comparison of an instantaneous temporal progression of the detection signal and/or of the additional criterion with the stored data pattern.

2. The safety device in accordance with claim 1, wherein the evaluation unit is adapted to generate the data pattern as part of a teaching process.

3. The safety device in accordance with claim 1, wherein the evaluation unit is adapted to generate, to expand, and/or to adjust the data pattern during the continuous operation of the machine.

4. The safety device in accordance with claim 1,
wherein the evaluation unit is adapted to read the data pattern from a connected external storage unit and/or to output it to a connected external storage unit.

5. The safety device in accordance with claim 1,
wherein the safety device has a signal output for outputting the output signal that is connectable to a control input of the machine.

6. The safety device in accordance with claim 1,
wherein the output signal is a switching signal that effects a switching off of the machine and/or allows a putting into operation of the machine.

7. The safety device in accordance with claim 1,
wherein the object is an actuator associated with the sensor.

8. The safety device in accordance with claim 7,
wherein the actuator is coded such that the actuator can be associated with the sensor and/or the actuator can be identified by the sensor.

9. The safety device in accordance with claim 1,
wherein the sensor is selected from a group of sensors, said group comprising:
a mechanical sensor that is adapted to detect a mechanical contact with the object or a force exerted by the object;
an inductive sensor that is adapted to detect a ferromagnetic or non-magnetic conductive object;
a capacitive sensor that is adapted to detect a metallic or non-metallic object;
a magnetic sensor that is adapted to detect a magnetic field generated by the object;
an optical sensor that is adapted to detect light reflected or remitted by the object;
a sound sensor that is adapted to detect sound waves reflected or transmitted by the object; and
an RFID sensor that is configured to receive a code that was transmitted by an RFID transponder arranged at the object.

10. The safety device in accordance with claim 1,
wherein the at least one additional criterion comprises at least one of an approach speed of the object to the sensor, a temporal progression of the approach speed, a dwell time of the object in the monitored zone, and a repetition rate of sequential detections of objects in the monitored zone.

11. The safety device in accordance with claim 1,
wherein the evaluation unit is connected to at least one vibration sensor or tremor sensor that is adapted to detect vibrations or tremors generated by the operation of the secured machine, with the at least one additional criterion comprising at least one characteristic of the detected vibrations or tremors.

* * * * *